(12) United States Patent
Tseng

(10) Patent No.: US 9,190,538 B2
(45) Date of Patent: Nov. 17, 2015

(54) OPTICAL CONNECTOR

(71) Applicant: HON HAI PRECISION INDUSTRY CO., LTD., New Taipei (TW)

(72) Inventor: Kuo-Fong Tseng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 129 days.

(21) Appl. No.: 14/050,363

(22) Filed: Oct. 10, 2013

(65) Prior Publication Data

US 2014/0308000 A1  Oct. 16, 2014

(30) Foreign Application Priority Data

Apr. 10, 2013  (TW) .............................. 102112594 A

(51) Int. Cl.
G02B 6/32       (2006.01)
H01L 31/02      (2006.01)
G02B 6/42       (2006.01)

(52) U.S. Cl.
CPC ........ *H01L 31/02016* (2013.01); *G02B 6/4204* (2013.01); *G02B 6/428* (2013.01)

(58) Field of Classification Search
CPC .................................................. G02B 6/4204
See application file for complete search history.

(56) References Cited

U.S. PATENT DOCUMENTS

| | | | |
|---|---|---|---|
| 4,487,474 A * | 12/1984 | Nishie et al. ..................... 385/66 |
| 5,546,496 A * | 8/1996 | Kimoto et al. ................ 385/146 |
| 5,835,646 A * | 11/1998 | Yoshimura et al. ............. 385/14 |
| 2003/0113071 A1* | 6/2003 | Kim et al. ........................ 385/76 |
| 2008/0267563 A1* | 10/2008 | Miyanari et al. ................ 385/33 |

\* cited by examiner

*Primary Examiner* — Tina Wong
*Assistant Examiner* — Chad Smith
(74) *Attorney, Agent, or Firm* — Novak Druce Connolly Bove + Quigg LLP

(57) ABSTRACT

An optical connector includes a circuit board. The circuit board includes a substrate and a circuit unit. A photoelectric element and a driver chip are located on the substrate. The photoelectric element includes a conductive pin and a metallic layer. The conductive pin is formed on a surface of the photoelectric element away from the circuit board, and the metallic layer is formed on another surface of the photoelectric element facing the circuit board. The conductive pin and the metallic layer serve as terminals of the photoelectric element. The driver chip is electrically connected to the photoelectric element by the circuit unit.

8 Claims, 1 Drawing Sheet

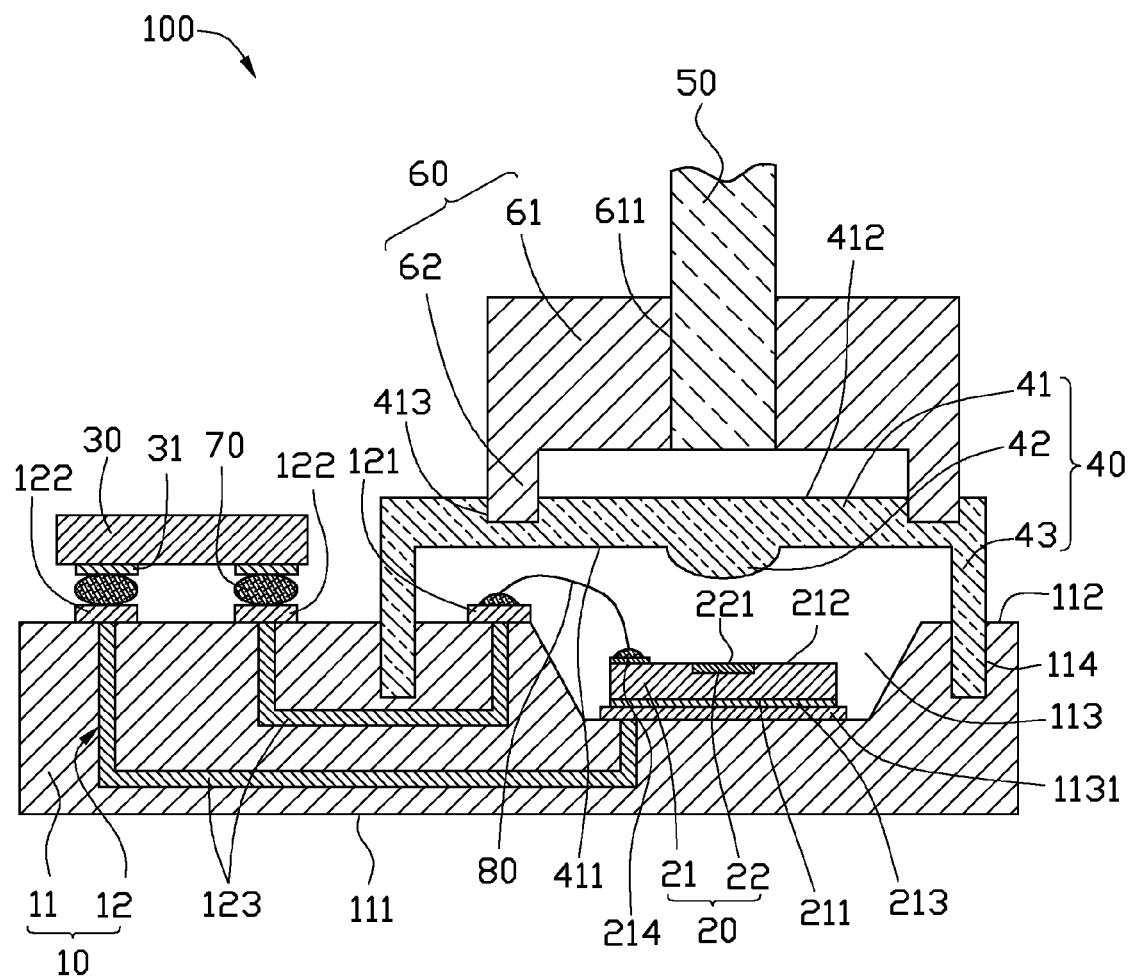

OPTICAL CONNECTOR

BACKGROUND

1. Technical Field

The present disclosure relates to communication devices, and particularly to an optical connector.

2. Description of Related Art

Optical connectors include a circuit board, a photoelectric element, and a driver chip. The photoelectric element and the driver chip are located on the circuit board and are electrically connected to each other by circuits formed in the circuit board. However, the circuits are often complicated, resulting in an increased cost of the optical connector.

Therefore, what is needed is an optical connector addressing the limitations described.

BRIEF DESCRIPTION OF THE DRAWING

The components of the drawing are not necessarily drawn to scale, the emphasis instead being placed upon clearly illustrating the principles of the embodiments of the present disclosure.

The FIGURE is a schematic view of an optical connector, according to an exemplary embodiment of the present disclosure.

DETAILED DESCRIPTION

The FIGURE shows an optical connector 100, according to an exemplary embodiment. The optical connector 100 includes a circuit board 10, a photoelectric element 20, a driver chip 30, a lens element 40, a light waveguide unit 50, and a connector 60.

The circuit board 10 includes a substrate 11 and a circuit unit 12 formed in the substrate 11. The substrate 11 includes a first surface 111 and an opposite second surface 112. In this embodiment, a material of the substrate 11 is silicon. The substrate 11 defines a receiving groove 113 and a number of positioning holes 114 around the receiving groove 113. The receiving groove 113 and the positioning holes 114 are defined in the second surface 112. The substrate 11 includes a first metallic layer 1131 formed on a bottom surface of the receiving groove 113. The circuit unit 12 is configured for electrically connecting the photoelectric element 20 to the driver chip 30. The circuit unit 12 includes a first electrical contact 121 corresponding to the photoelectric element 20, two second electrical contacts 122 corresponding to the driver chip 30, and two connecting portions 123. The first electrical contact 121 and the second electrical contacts 122 are formed on the second surface 112. The first electrical contact 121 is located adjacent to the receiving groove 113. The connecting portions 123 are embedded in the substrate 11. Two ends of one of the connecting portions 123 are respectively connected to the first electrical contact 121 and one of the second electrical contacts 122, and two ends of the other portion 123 are respectively connected to the first metallic layer 1131 and the other second electrical contact 122.

The photoelectric element 20 is configured for emitting/receiving optical signals. The photoelectric element 20 can be a laser diode, a photodiode, or a combination of a laser diode and a photodiode. In this embodiment, the photoelectric element 20 includes a laser diode and a photodiode. The photoelectric element 20 includes a base portion 21 and an optical portion 22 formed on the base portion 21. The base portion 21 includes a bottom surface 211 and a top surface 212 opposite to the bottom surface 211. A second metallic layer 213 is formed on the bottom surface 211, and a first conductive pin 214 is formed on the top surface 212. The first conductive pin 214 corresponds to the first electrical contact 121. The first conductive pin 214 and the second metallic layer 213 serve as terminals of the photoelectric element 20. The photoelectric element 20 emits/receives optical signals via the optical portion 22. The optical portion 22 includes an optical surface 221, which serves as an emergent/incident surface of optical signals. The photoelectric element 20 is received in the receiving groove 113, such that the second metallic layer 213 is attached to the first metallic layer 1131. The first metallic layer 1131 and the second metallic layer 213 are connected to each other via a eutectic manner, thereby eliminating a need for an adhesive for fixing the photoelectric element 20 to the substrate 11. Therefore, a mounting accuracy of the photoelectrical element 20 is ensured. The first conductive pin 214 is electrically connected to the first electrical contact 121 by a conductive wire 80.

The material of the first metallic layer 1131 and the second metallic layer 213 can be one or more of the following alloys: gold-tin, tin-antimony, tin-silver, tin-lead, indium-silver, indium-tin, and tin-silver-copper. The first metallic layer 1131 and the second metallic layer 213 can be formed using a vacuum evaporating method or a magnetron sputtering method, for example.

The driver chip 30 is configured for driving the photoelectric element 20 to emit/receive optical signals. The driver chip 30 includes a number of second conductive pins 31 corresponding to the second electrical contacts 122. The driver chip 30 is mechanically and electrically connected to the circuit board 10, such that a surface having the second conductive pins 31 faces toward the circuit board 10. In this embodiment, the driver chip 30 is connected to the circuit board 10 via a flip chip. In detail, the second conductive pins 31 are electrically connected to the corresponding second electrical contacts 122 by a number of corresponding soldering balls 70. The driver chip 30 and the photoelectric element 20 are electrically connected to each other by the conductive circuit 12.

The lens element 40 is configured for optically coupling the photoelectric element 20 to the light waveguide unit 50. The lens element 40 includes a main portion 41, a converging portion 42, and a number of first positioning portions 43. The first positioning portions 43 correspond to the positioning holes 114. The main portion 41 includes a first surface 411 and a second surface 412 opposite to the first surface 411. The converging portion 42 and the first positioning portions 43 protrude from the first surface 411. The lens element 40 defines a number of second positioning holes 413 in the second surface 412. The lens element 40 is connected to the circuit board 10 by the first positioning portions 43 being received in the first positioning holes 114. The converging portion 42 is aligned with the optical surface 221.

The light waveguide unit 50 is configured for transmitting optical signals. The light waveguide unit 50 is positioned at a side of the lens element 40 away from the circuit board 10. An end of the light waveguide unit 50 is aligned with the converging portion 42. The light waveguide unit 50 can be a planar light waveguide or an optical fiber.

The connector 60 is configured for connecting the light waveguide unit 50 to the lens element 40. The connector 60 includes a main body 61 and a number of second positioning portions 62 corresponding to the second positioning holes 413. The connector 60 defines a fixing hole 611. The end of the light waveguide unit 50 is fixedly received in the fixing hole 611. The second positioning portions 62 are correspondingly received in the second positioning holes 413. In this embodiment, the connector 60 is made of ceramic.

The optical connector 100 of the above-described disclosure has a simplified arrangement of electrical connections between the circuit board and the optical connector. Therefore, a cost of the optical connector is effectively decreased.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. An optical connector, comprising:
    a circuit board comprising a substrate and a circuit unit formed in the substrate;
    a photoelectric element positioned on the substrate, the photoelectric element comprising a first conductive pin and a first metallic layer, the first conductive pin being formed on a surface of the photoelectric element away from the circuit board, the first metallic layer being formed on another surface of the photoelectric element facing toward the circuit board, and the first conductive pin and the first metallic layer serving as terminals of the photoelectric element;
    a driver chip positioned on the substrate, the driver chip being electrically connected to the photoelectric element by the circuit unit;
    a light waveguide unit for transmitting optical signals;
    a lens element positioned between the photoelectric element and the light waveguide unit for optically coupling the light waveguide to the photoelectric element; and
    a connector connecting the light waveguide unit to the lens element;
    wherein the substrate comprises a first surface and a second surface opposite to the second surface, the substrate defines a receiving groove in the second surface, the photoelectric element is positioned on a bottom surface of the receiving groove, and the driver chip is positioned on the second surface;
    wherein the circuit unit comprises a first electrical contact connected to the photoelectric element, two second electrical contacts connected to the driver chip, and two connecting portions, two ends of one of the connecting portions are respectively connected to the first electrical contact and one of the second electrical contacts, and two ends of the other of the connecting portions are respectively connected to the first metallic layer and the other of the second electrical contacts;
    wherein the first electrical contact and the second electrical contacts are formed on the second surface, the connecting portions are embedded in the substrate.

2. The optical connector of claim 1, wherein the substrate comprises a second metallic layer formed on the bottom surface of the receiving groove, the first metallic layer is attached on the second metallic layer.

3. The optical connector of claim 2, wherein the first metallic layer and the second metallic layer are connected to each other via a eutectic manner.

4. The optical connector of claim 1, wherein the lens element comprises a main portion and a converging portion formed on the main portion, the converging portion is aligned with the photoelectric element.

5. The optical connector of claim 4, wherein the lens element comprises a plurality of first positioning portions protruding from a surface of the main portion facing toward the circuit board, the substrate defines a plurality of positioning holes corresponding to the positioning portions, the positioning portions respectively insert into the first positioning holes.

6. The optical connector of claim 5, wherein the connector comprises a main body and a plurality of second positioning portions, the lens element defines a plurality of second positioning holes corresponding to the second positioning portions, the second positioning holes are defined in a surface of the main body away from the circuit board, the second positioning portions respectively insert into the second positioning holes.

7. The optical connector of claim 6, wherein the connector defines a fixing hole, an end of the light waveguide unit is received and fixed in the fixing hole and is aligned with the converging portion.

8. The optical connector of claim 1, wherein the connector is made from ceramic.

* * * * *